United States Patent
Hattori et al.

(10) Patent No.: US 8,124,995 B2
(45) Date of Patent: Feb. 28, 2012

(54) SEMICONDUCTOR LIGHT-EMITTING DEVICE

(75) Inventors: Yasushi Hattori, Kawasaki (JP); Shinji Saito, Yokohama (JP); Ryosuke Hiramatsu, Kawasaki (JP); Shinya Nunoue, Ichikawa (JP); Iwao Mitsuishi, Machida (JP); Naotoshi Matsuda, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 12/493,585

(22) Filed: Jun. 29, 2009

(65) Prior Publication Data

US 2009/0321771 A1    Dec. 31, 2009

(30) Foreign Application Priority Data

Jun. 30, 2008    (JP) .................. 2008-170433

(51) Int. Cl.
*H01L 33/00* (2010.01)
(52) U.S. Cl. ............. 257/98; 257/E33.061; 372/21; 372/50.124; 372/70; 372/99; 362/257; 362/260; 362/296.01; 362/300; 362/307
(58) Field of Classification Search ............ 372/21, 372/50.124, 70, 99; 257/98, E33.061; 362/257, 362/260, 296.01, 300, 307
See application file for complete search history.

(56) References Cited

U.S. PATENT DOCUMENTS

| | | | |
|---|---|---|---|
| 7,989,833 B2 * | 8/2011 | Scianna et al. | 257/98 |
| 2005/0051790 A1 * | 3/2005 | Ueda | 257/99 |
| 2006/0124942 A1 * | 6/2006 | Maeda et al. | 257/89 |
| 2006/0139926 A1 * | 6/2006 | Morioka et al. | 362/260 |
| 2006/0291246 A1 * | 12/2006 | Hattori et al. | 362/614 |

FOREIGN PATENT DOCUMENTS

| | | |
|---|---|---|
| JP | 2005-205195 | 8/2005 |
| JP | 2006-210887 | 8/2006 |
| JP | 2008-108553 | 5/2008 |

OTHER PUBLICATIONS

U.S. Appl. No. 12/638,354, filed Dec. 15, 2009, Hashimoto et al.
U.S. Appl. No. 12/729,636, filed Mar. 23, 2010, Hattori, et al.
U.S. Appl. No. 12/874,778, filed Sep. 2, 2010, Saito, et al.
U.S. Appl. No. 12/876,675, filed Sep. 7, 2010, Hattori, et al.
U.S. Appl. No. 12/876,774, filed Sep. 7, 2010, Hattori, et al.
U.S. Appl. No. 12/876,738, filed Sep. 7, 2010, Hattori, et al.

* cited by examiner

*Primary Examiner* — Yuanda Zhang
(74) *Attorney, Agent, or Firm* — Oblon, Spivak, McClelland, Maier & Neustadt, L.L.P.

(57) ABSTRACT

A semiconductor light-emitting device includes a semiconductor light-emitting element emitting light in a region ranging from ultraviolet to visible, and a visible-light luminescent element absorbing light emitted from the semiconductor light-emitting element and outputting visible light. The visible-light luminescent element includes a substrate, a light-reflecting layer formed on the substrate and containing light scattering particles, and a luminescent layer containing phosphor particles. The luminescent layer absorbs light emitted from the semiconductor light-emitting element and output visible light. The luminescent layer further absorbs light that is emitted from the semiconductor light-emitting element, arrives at and is reflected from the light scattering particles, and output the visible light.

19 Claims, 4 Drawing Sheets

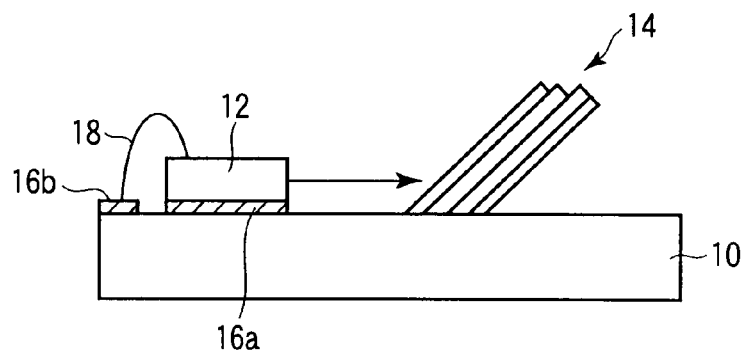
F I G. 1
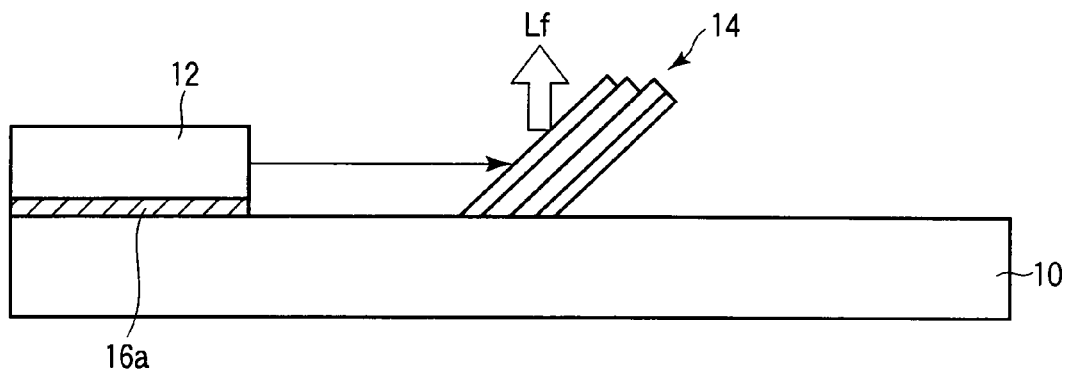
F I G. 2
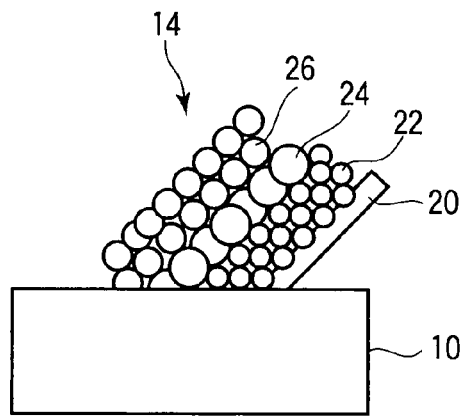
F I G. 3

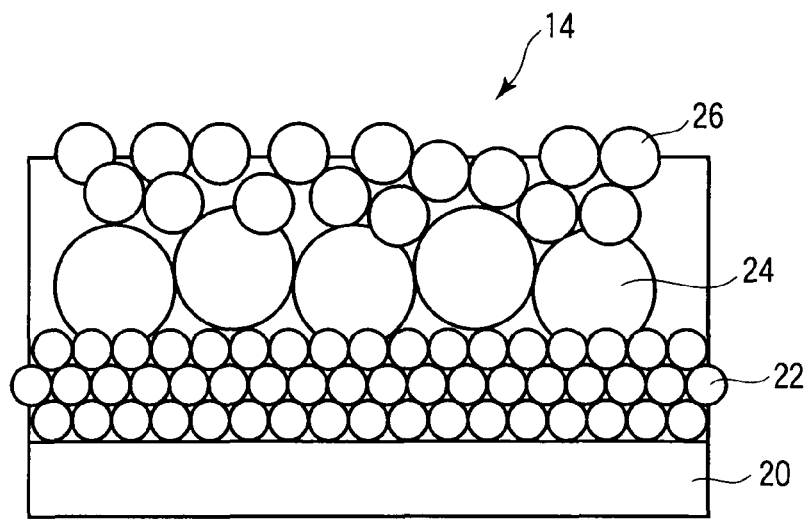
F I G. 4
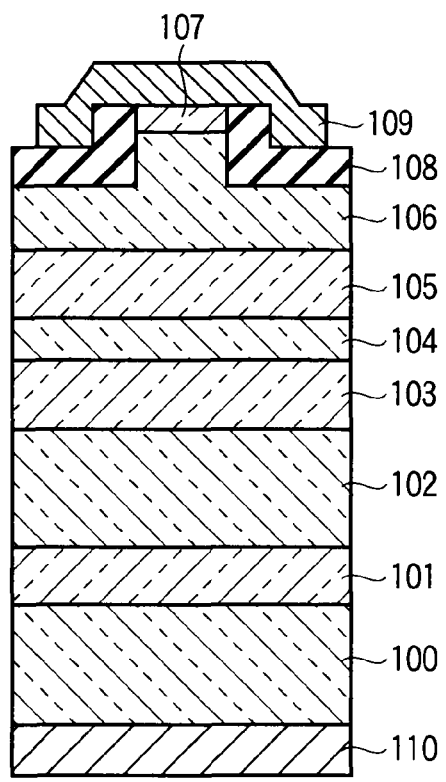
F I G. 5

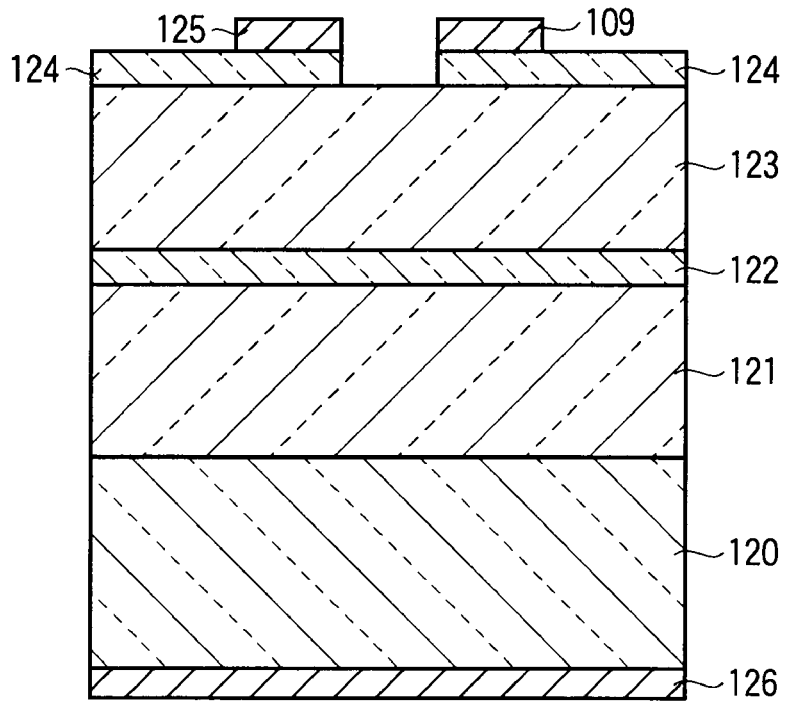
F I G. 6
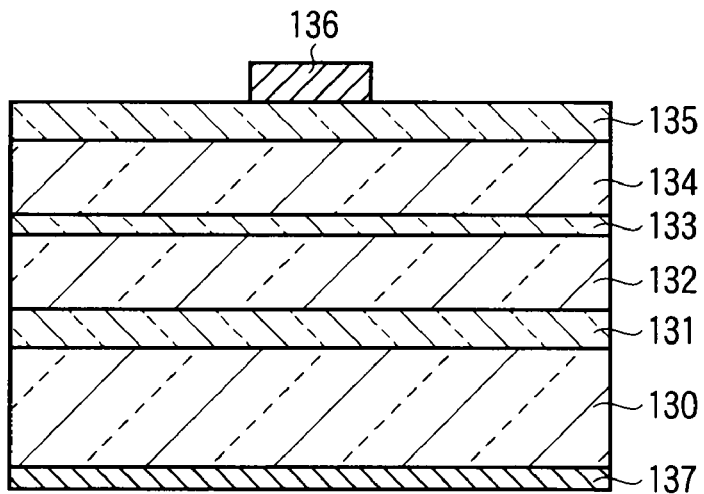
F I G. 7

SEMICONDUCTOR LIGHT-EMITTING DEVICE

CROSS-REFERENCE TO RELATED APPLICATIONS

This application is based upon and claims the benefit of priority from prior Japanese Patent Application No. 2008-170433, filed Jun. 30, 2008, the entire contents of which are incorporated herein by reference.

BACKGROUND OF THE INVENTION

1. Field of the Invention

This invention relates to a semiconductor light-emitting device, and, in particular, to a semiconductor light-emitting device formed of a combination of a semiconductor light-emitting element and a visible-light luminescent element containing a phosphor.

2. Description of the Related Art

In recent years, there have been proposed various kinds of light-emitting devices wherein a semiconductor light-emitting element is combined with a phosphor (for example, see JP-A 2005-205195 and JP-A 2006-210887). The phosphor to be used in these light-emitting devices is capable of absorbing excitation light emitted from a semiconductor light-emitting element and capable of emitting light having a different wavelength from that of the excitation light, thus functioning as a light source.

JP-A 2005-205195 describes a light-emitting device excellent in luminescence and color rendering. This light-emitting device employs an optical fiber as an optical waveguide of the excitation light and is constructed such that the optical fiber is provided at its distal end with a phosphor and that the light from the light-emitting element is irradiated onto the phosphor through the optical fiber.

JP-A 2006-210887 describes a light-emitting device excellent in light extraction efficiency, this light-emitting device being provided with a semiconductor light-emitting element capable of emitting excitation light and with a dispersion member having the phosphor dispersed therein. In this light-emitting device, the light to be emitted from the phosphor in the dispersion member is extracted from the excitation light incidence side of the dispersion member.

These light-emitting devices described in these JP-A 2005-205195 and JP-A 2006-210887 however fail to take into consideration the following problems. Namely, in these light-emitting devices, the excitation light is concentrated at one point of the phosphor, creating a point light source exhibiting high brightness and increasing excitation density, thereby raising various problems such as the decrease in light-emitting efficiency and the deterioration of materials due to the generation of heat resulting from the emission of light. Because of these problems, it is impossible to sufficiently increase the excitation density and to utilize a light-emitting element capable of outputting a high-energy beam, so that these light-emitting devices cannot be applied to an apparatus requiring a high luminous flux such as a lighting apparatus, an image display apparatus, etc.

BRIEF SUMMARY OF THE INVENTION

It is an object of the present invention to provide a semiconductor light-emitting device capable of suppressing the deterioration of materials and also capable of suppressing the decrease in light-emitting efficiency that may be caused by the generation of heat, thereby making it possible to utilize high-energy excitation light, allowing the device to output visible light of high luminous flux.

According to one aspect of the present invention, there is provided a semiconductor light-emitting device comprising: a semiconductor light-emitting element emitting light in a region ranging from ultraviolet to visible; and a visible-light luminescent element absorbing light emitted from the semiconductor light-emitting element and outputting visible light; wherein the visible-light luminescent element includes a substrate; a light-reflecting layer formed on the substrate and containing light scattering particles; and a luminescent layer containing phosphor particles, the luminescent layer absorbs light emitted from the semiconductor light-emitting element and output visible light, and the luminescent layer further absorbs light that is emitted from the semiconductor light-emitting element, arrives at and is reflected from the light scattering particles, and output the visible light.

BRIEF DESCRIPTION OF THE SEVERAL VIEWS OF THE DRAWING

FIG. 1 is a cross-sectional view illustrating a semiconductor light-emitting device according to one embodiment of the present invention;

FIG. 2 is a cross-sectional view illustrating a state wherein the excitation light Le from the light-emitting element is absorbed by a luminescent element and then emitted as output visible light Lf;

FIG. 3 is a cross-sectional view illustrating the construction of a luminescent element of the semiconductor light-emitting device according to one embodiment of the present invention;

FIG. 4 is an enlarged view of the luminescent element shown in FIG. 3;

FIG. 5 is a cross-sectional view showing the construction of an edge-face emitting type AlGaInN laser diode to be used in the semiconductor light-emitting device according to one embodiment of the present invention;

FIG. 6 is a cross-sectional view showing the construction of a vertical-cavity surface emitting type laser (VCSEL) to be used in the semiconductor light-emitting device according to one embodiment of the present invention;

FIG. 7 is a cross-sectional view showing the construction of an edge-face emitting MgZnO laser diode to be used in the semiconductor light-emitting device according to one embodiment of the present invention;

DETAILED DESCRIPTION OF THE INVENTION

Figure 8:
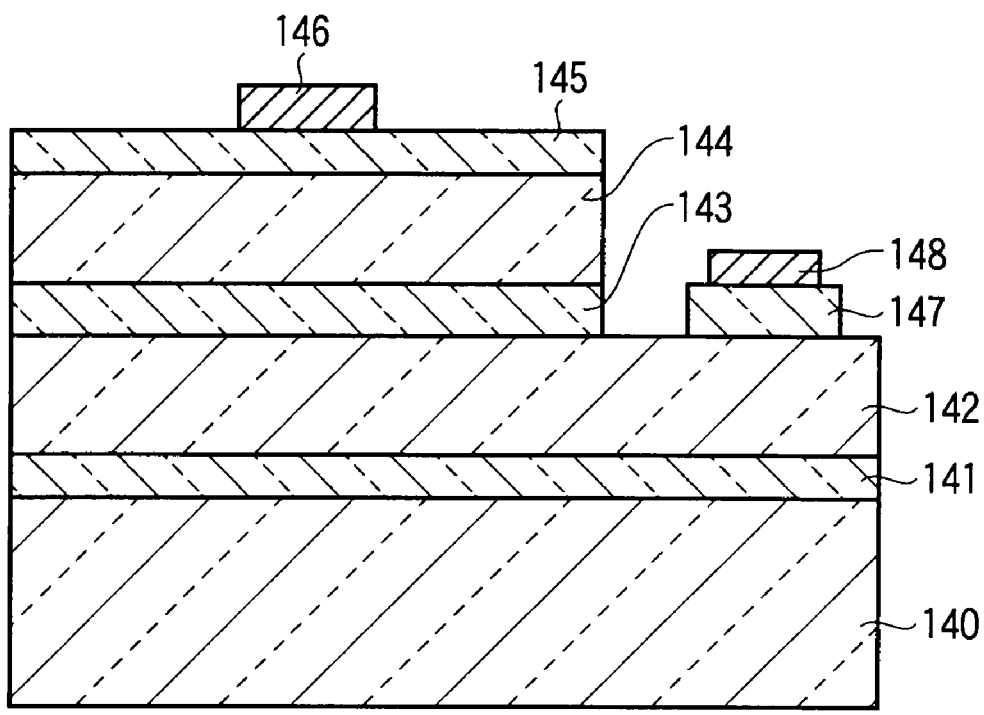
FIG. 8 is a cross-sectional view showing the construction of an edge-face emitting type MgZnO laser diode to be used in the semiconductor light-emitting device according to one embodiment of the present invention.

There will now be explained various embodiments of the present invention with reference to drawings. In the explanation of the following drawings, the same or similar portions are represented by the same or similar reference numbers.

FIG. 1 shows a light-emitting device according to a first embodiment of the present invention, which is constructed such that a light-emitting element 12 and a luminescent element 14 are arranged on the surface of a mounting board 10. This mounting board 10 is provided, on the surface thereof, with interconnection layers 16a and 16b. The light-emitting element 12 is mounted on the interconnection layer 16a. The interconnection layer 16b is electrically connected, via a bonding wire 18, with the electrode (not shown) of the light-emitting element 12.

As for the materials for the mounting board 10, it is preferable to employ materials excellent in heat conductivity. For example, it is possible to employ aluminum nitride (AlN), alumina ($Al_2O_3$), copper (Cu), boron nitride (BN), plastic, ceramic, diamond, etc. By making use of the mounting board 10 formed of any of these materials, it is possible to effectively liberate the heat to be generated from the operation of the light-emitting element 12.

With respect to the interconnection layers 16a and 16b, it is preferable to employ a material having a low electrical resistance and a low coefficient of absorption of visible light. For example, the interconnection layers 16a and 16b may be formed of a metallic material such as Au, Ag, Cu, Cu alloys or tungsten (W). The interconnection layers 16a and 16b may be constituted by a thin-film interconnection layer or a thick-film interconnection layer. In order to enhance the bondability, the interconnection layers 16a and 16b may be provided, on the surface thereof, with an Au-plating, an Ag-plating, a Pd-plating or a solder-plating.

With respect to the boding wire 18, it is preferable to employ a material having a low electrical resistance and a low coefficient of absorption of visible light. For example, it is possible to employ an Au wire. Alternatively, a wire formed of a combination of a noble metal such as Pt and Au may be employed.

The luminescent element 14 is formed of a multi-layer structure and disposed in such a manner that it is inclined at an angle of not less than 30° and less than 90° to the surface of the mounting board 10 and that it intersects with the laser to be emitted from the light-emitting element 12.

As shown in FIG. 2, the light-emitting element 12 emits excitation light Le ranging from ultraviolet to visible in emission spectrum, thereby irradiating the luminescent element 14 with the excitation light Le. The phosphor contained in the luminescent element 14 absorbs this excitation light Le and to isotropically emit visible light. The visible light thus emitted is repeatedly reflected in the interior of the light-emitting element 12 and is output as visible light Lf from the luminescent element 14 to the exterior.

As shown in FIG. 3, the luminescent element 14 is formed of a multi-layered structure formed on the substrate 20 and comprising a white particle layer 22, a phosphor layer 24 and an inorganic transparent layer 26 which are successively formed. An enlarged structure of the luminescent element 14 is shown in FIG. 4.

As shown in FIG. 4, in this luminescent element 14, while the white particle layer 22 and the phosphor layer 24 are respectively formed on the substrate 20, the inorganic transparent layer 26 is formed so that it partially enters the interstices formed between the light scattering particles and the phosphor particles, thereby entirely covering and fixing the white particle layer 22 and the phosphor layer 24.

The excitation light entering the interior of the luminescent element 14 is absorbed by the phosphor particles contained in the phosphor layer 24. Part of the excitation light is allowed to pass through the inorganic transparent layer 26. The excitation light that has passed through the inorganic transparent layer 26 is reflected by the white particle layer 22 and again allowed to enter and be absorbed by the phosphor layer 24. For this reason, most of the excitation light is absorbed by the phosphor layer 24. The phosphor layer 24 that has absorbed the excitation light consequently emits visible light. The visible light thus emitted passes through the inorganic transparent layer 26 and part of the visible light thus emitted is reflected by the white particle layer 22, thereby allowing the visible light to be output as visible light Lf from the luminescent element 14.

As for the materials of the substrate 20, it is possible to employ aluminum, copper, stainless steel, ceramic, etc. Especially, it is more preferable to employ a metal such as aluminum, copper, stainless steel, etc. As for the ceramic, it is preferable to employ aluminum nitride (AlN) excellent in heat dissipation.

Further, the substrate 20 formed of an aluminum plate polished to have a mirror-like surface or formed of a glass plate, ceramic plate, copper plate or aluminum plate each covered with a silver film on the surface thereof is advantageous in that the visible light reflectance can be increased and the thickness of the white particle layer 22 can be decreased while retaining the emission efficiency, thereby making it possible to further enhance the heat dissipation. Namely, since the heat that has been generated at the luminescent element 14 due to the absorption of the excitation light Le can be dissipated to the exterior through the substrate 20 exhibiting excellent heat dissipation, the temperature of the luminescent element 14 can be prevented from increasing. In this case, in order to enhance the emission efficiency and the effects of heat dissipation, the substrate 20 should preferably be selected from those capable of reflecting the visible light at a ratio of 75% or more.

With respect to the thickness of the substrate 20, there is not any particular limitation. Namely, the thickness of the substrate 20 can be optionally selected as long as the substrate 20 retains thereon the white particle layer 22, the phosphor layer 24 and the inorganic transparent layer 26.

The white particle layer 22 is designed to have the function of reflecting the visible light on the surface of the light scattering particles forming the white particle layer 22. As for the light scattering particles, it is possible to employ $BaSO_4$, MgO, $TiO_2$, $AlO_3$, ZnO and $SiO_2$. With respect to the thickness of the white particle layer 22, although there is no particular limitation, it is preferably no greater than 300 μm, more preferably in the range of 5-300 μm.

With respect to the inorganic transparent material forming the inorganic transparent layer 26, it is possible to employ an alkali metal silicate such as barium silicate that has been precipitated from water glass by a sedimentation method.

With respect to the phosphor forming the phosphor layer 24, it is possible to employ a material capable of absorbing light in the region ranging from ultraviolet to blue and emitting visible light. For example, it is possible to employ a fluorescent material such as a silicate-based fluorescent material, an aluminate fluorescent-based material, a nitride-based fluorescent material, a sulfide-based fluorescent material, an oxysulfide-based fluorescent material, a YAG-based fluorescent material, a borate-based fluorescent material, a phosphate-based fluorescent material, a halo-phosphate-based fluorescent material, etc. The following are specific examples of each of these fluorescent materials.

(1) Silicate-based fluorescent material: $(Sr_{(1-x-y-z)}Ba_xCa_yEu_z)_2Si_wO_{(2+2w)}$ ($0 \leq x < 1$, $0 \leq y < 1$, $0.05 \leq z \leq 0.2$, $0.90 \leq w \leq 1.10$)

Among the silicate-based fluorescent materials represented by the aforementioned formula, it is more preferable to employ those having a composition where x=0.19, y=0, z=0.05, w=1.0. In order to stabilize the crystal structure and to enhance the emission intensity, part of strontium (Sr), barium (Ba) and calcium (Ca) may be replaced by Ma and/or Zn.

It is also possible to employ other kinds of silicate-based fluorescent materials having a different composition from those described above. For example, it is possible to employ $MSiO_3$, $MSiO_4$, $M_2SiO_3$, $M_2SiO_5$ and $M_4Si_2O_8$ (wherein M is at least one element selected from the group consisting of Sr, Ba, Ca, Mg, Be, Zn and Y). Additionally, for the purpose of controlling the luminescent color in this silicate-based fluorescent material, part of Si may be replaced by germanium (Ge) (for example, $Sr_{(1-x-y-z)}Ba_xCa_yEu_z)_2(Si_{(1-u)}Ge_u)O_4$).

Further, at least one of the elements selected from the group consisting of Ti, lead (Pb), manganese (Mn), arsenic (As), Al, praseodymium (Pr), terbium (Tb) and cerium (Ce) may be contained therein as an activator.

(2) Aluminate fluorescent-based material: $M_4Al_{10}O_{17}$ (wherein M is at least one element selected from the group consisting of Ba, Sr, Mg, Zn and Ca)

Europium (Eu) and/or Mn may be contained therein as an activating agent.

It is also possible to employ other kinds of aluminate-based fluorescent materials having a different composition from those described above. For example, it is possible to employ $MAl_2O_4$, $MAl_4O_{17}$, $MAl_8O_{13}$, $MAl_{12}O_{19}$, $M_2Al_{19}O_{17}$, $M_2Al_{11}O_{19}$, $M_3Al_5O_{12}$, $M_3Al_{16}O_{27}$ and $M_4Al_5O_{12}$ (wherein M is at least one element selected from the group consisting of Ba, Sr, Ca, Mg, Be and Zn).

Further, at least one of the elements selected from the group consisting of Mn, dysprosium (Dy), Tb, neodium (Nd) and Ce may be contained therein as an activator.

(3) Nitride-based fluorescent material (mainly, silicon nitride-based fluorescent material): $L_xSi_yN_{(2x/3+4y/3)}$:Eu or $L_xSi_yO_zN_{(2x/3+4y/3-2z/3)}$:Eu (wherein L is at least one element selected from the group consisting of Sr and Ca)

Among the aforementioned compositions, it is more preferable to employ those having a composition where x=2 and y=5 or x=1 and y=7. However, the values of these x and y may be optionally selected.

More specifically, it is preferable to employ fluorescent materials wherein Mn is added as an activating agent to $(Sr_xCa_{(1-x)})_2Si_5N_8$:Eu, $Sr_2Si_5N_8$:Eu, $Ca_2Si_5N_8$:Eu, $Sr_xCa_{(1-x)}Si_7N_{10}$:Eu, $SrSi_7N_{10}$:Eu, $CaSi_7N_{10}$:Eu, etc.

These fluorescent materials may contain at least one element selected from the group consisting of Mg, Sr, Ca, Ba, Zn, B, Al, copper (Cu), Mn, chromium (Cr) and nickel (Ni). These fluorescent materials may further contain, as an activating agent, at least one element selected from the group consisting of Ce, Pr, Tb, Nd and lanthanum (La).

(4) Sulfide-based fluorescent material: $(Zn_{(1-x)}Cd_x)S$:M (wherein M is at least one element selected from the group consisting of Cu, chlorine (Cl), Ag, Al, iron (Fe), Cu, Ni and Zn; x is a number satisfying $0 \leq x \leq 1$)

Incidentally, sulfur (S) may be replaced by selenium (Se) and/or tellurium (Te).

(5) Oxysulfide-based fluorescent material: $(Ln_{(1-x)}Eu_x)O_2S$ (wherein Ln is at least one element selected from the group consisting of scandium (sc), Y, La, gadolinium (Gd) and lutetium (Lu); x is a number satisfying $0 \leq x \leq 1$)

Incidentally, at least one element selected from the group consisting of Tb, Pr, Mg, Ti, Nb, Ta, Ga, samarium (Sm) and thulium (Tm) may be contained therein as an activating agent.

(6) YAG-based fluorescent material: $(Y_{(1-x-y-z)}Gd_xLa_ySm_z)_3(Al_{(1-v)}Ga_v)_5O_{12}$:Ce,Eu ($0 \leq x \leq 1$, $0 \leq y \leq 1$, $0 \leq z \leq 1$, $0 \leq v \leq 1$,)

Incidentally, at least one element selected from Cr and Tb may be contained therein as an activating agent.

(7) Borate-based fluorescent material: $MnO_3$:Eu (wherein M is at least one element selected from the group consisting of Y, La, Gd, Lu and In)

Incidentally, Tb may be contained therein as an activating agent.

It is also possible to employ other kinds of borate-based fluorescent materials having a different composition ratio from those described above, specific examples of which including $Cd_2B_2O_5$:Mn, (Ce, Gd, Tb)$MgB_5O_{10}$:M, $GdMgB_5O_{10}$:Ce,Tb, etc.

(8) Phosphate/borate-based fluorescent material: $2(M_{(1-x)}M'_x)O.aP_2O_5.bB_2O_3$ (wherein M is at least one element selected from the group consisting of Mg, Ca, Sr, Ba and Zn; M' is at least one element selected from the group consisting of Eu, Mn, Sn, Fe and Cr; and x, a and b respectively represent a number satisfying $0.001 \leq x \leq 0.5$, $0 \leq a \leq 2$, $0 \leq b \leq 3$, $0.3 < (a+b)$)

(9) Phosphate-based fluorescent material: $(Sr_{(1-x)}Ba_x)_3(PO_4)_2$:Eu or $(Sr_{(1-x)}Ba_x)_2P_2O_7$:Eu,Sn Incidentally, Ti and/or Cu may be contained therein as an activating agent.

(10) Halo-phosphate-based fluorescent material: $(M_{(1-x)}Eu_x)_{10}(PO_4)_6Cl_2$ or $(M_{(1-x)}Eu_x)_5(PO_4)_3Cl$ (M is at least one element selected from the group consisting of Ba, Sr, Ca, Mg and Cd; and x is a number satisfying $0 \leq x \leq 1$)

Incidentally, at least part of Cl may be replaced by fluorine (F). Further Sb and/or Mn may be contained therein as an activating agent.

The aforementioned fluorescent materials may be optionally selected to employ them as a blue-luminescent element, a yellow-luminescent element, a green-luminescent element, a red-luminescent element or a white-luminescent element. Further, it is also possible to suitably combine plural kinds of fluorescent materials to create a luminescent element emitting an intermediate color. If it is desired to create a white-luminescent element, three kinds of fluorescent materials (a red-luminescent element, a green-luminescent element, a blue-luminescent element) each corresponding to three primary colors, i.e., red/green/blue (RGB), may be combined or alternatively additive complementary colors such as blue and yellow may be suitably combined to create a white-luminescent element.

If it is desired to secure the stability in light extraction efficiency and tint, it is preferable to form a combination of phosphor layers each incorporating one kind of fluorescent material corresponding to each of RGB, thereby making it possible to obtain a light-emitting device capable of emitting white light. On the other hand, if it is desired to attach importance to the easiness in the manufacture of luminescent element 14, it is preferable to employ a structure where phosphors are mixed together instead of forming these independent phosphor layers.

The content of the phosphor in the laminated layer formed on the mounting board 10 may be adjusted in such a manner that the excitation light emitted from the light-emitting element 12 can be effectively absorbed and permeated. Specifically, the thickness of phosphor layer 24 should preferably be adjusted to one to three times as large as the particle diameter of the phosphor in conformity with the color of emission that is desired to obtain. Further, it is preferable to use large phosphor particles having a particle diameter of 20 nm or more and excellent in emission intensity and emission efficiency. Therefore, the thickness of the phosphor layer 24 should preferably be confined to 20-100 μm or so.

According to the phosphor 14 constructed as described above, since any kind of resin that may become a main cause for the deterioration of the phosphor 14 is not employed and since the heat generated therein can be effectively dissipated even if the excitation light Le of high energy is output from the light-emitting element 12, it is possible to output visible light of high luminous flux with high efficiency.

Next, the light-emitting element 12 to be used in the semiconductor light-emitting device according to one embodiment of the present invention will be explained.

With respect to specific examples of the light-emitting element 12, it is possible to employ those having an emission peak in the region ranging from blue to ultraviolet wherein the wavelength does not exceed about 430 nm. The light-emitting element 12 may be of an edge-face emitting type or a surface emitting type. More specifically, it is possible to employ a semiconductor laser diode or a light-emitting diode, wherein a III-V group compound semiconductor such as aluminum/gallium/indium nitride (AlGaInN) or a II-VI group compound semiconductor such as magnesium/zinc oxide (MgZnO) is used as a luminescent layer (active layer).

For example, the III-V group compound semiconductor to be used as a luminescent layer may be a nitride semiconductor containing at least one metal selected from the group consisting of Al, Ga and In. This nitride semiconductor can be specifically represented by $Al_xGa_yIn_{(1-x-y)}$ ($0 \leq x \leq 1$, $0 \leq y \leq 1$, $0 \leq (x+y) \leq 1$). The nitride semiconductor of this kind includes a two-component system such as AlN, GaN and InN; a three-component system such as $Al_xGa_{(1-x)}N$ ($0 \leq x \leq 1$), $Al_xIn_{(1-x)}N$ ($0 \leq x \leq 1$) and $Ga_yIn_{(1-y)}N$ ($0 < y < 1$); and a four-component system containing all of these elements.

Based on the compositions x, y and (1-x-y) representing Al, Ga and In, respectively, the wavelength of the emission peak in the region ranging from ultraviolet to blue can be determined. Further, a part of the III group elements may be replaced by boron (B), thallium (Tl), etc. Further, a part of N of the V group elements may be replaced by phosphorus (P), arsenic (As), antimony (Sb), bismuth (Bi), etc.

Likewise, the II-VI group compound semiconductor to be used as a luminescent layer is an oxide semiconductor containing at least one metal selected from Mg and Zn. More specifically, this oxide semiconductor may be represented by $Mg_zZn_{(1-z)}$ ($0 \leq z \leq 1$) and the wavelength of the emission peak in the ultraviolet part of the spectrum can be determined based on the compositions z and (1-z) representing Mg and Zn, respectively.

Next, specific examples of the light-emitting element which can be used in the present invention will be explained.

FIG. 5 shows one example of an edge-face emitting type AlGaInN-based laser diode. As shown in FIG. 5, this AlGaInN-based laser diode is formed of a laminated structure including an n-type GaN substrate 100, on which an n-type GaN buffer layer 101, an n-type AlGaN clad layer 102, an n-type GaN optical guide layer 103, a GaInN luminescent layer 104, a p-type GaN optical guide layer 105, a p-type AlGaN clad layer 106 and a p-type GaN contact layer 107 are successively laminated. An insulating film 108 is formed on the ridge sidewall of the p-type GaN contact layer 107 and on the surface of the p-type AlGaN clad layer 106. A p-type electrode 109 is formed on the surfaces of the p-type GaN contact layer 107 and of the insulating film 108. An n-side electrode 110 is attached to the underside of the n-type GaN substrate 100.

FIG. 6 shows one example of a vertical-cavity surface-emitting type laser (VCSEL). As shown in FIG. 6, this VCSEL is formed of a laminated structure including an n-type substrate 120, on which an n-type multi-layered distribution Bragg's reflector (DBR) 121, a quantum well layer (MQW) 122 and a p-type multi-layer film DBR 123 are successively laminated. A p-side electrode 125 is attached, via a contact layer 124, to the surface of the p-type multi-layer film DBR 123. An n-type electrode 126 is attached to the underside of the n-type substrate 120.

FIGS. 7 and 8 illustrate, respectively, one example of the edge-face emitting type MgZnO-based laser diode. In the case of the MgZnO-based laser diode shown in FIG. 7, a silicon (Si) substrate 130 is employed. On the other hand, in case of the MgZnO-based laser diode shown in FIG. 8, a sapphire substrate 140 is employed.

The MgZnO-based laser diode shown in FIG. 7 is formed of a laminated structure including a Si substrate 130, on which a metallic reflection layer 131, a p-type MgZnO clad layer 132, an i-type MgZnO luminescent layer 133, an n-type MgZnO clad layer 134 and an n-type MgZnO contact layer 135 are successively laminated. An n-side electrode 136 is attached to the n-type contact layer 135. A p-side electrode 137 is attached to the substrate 130.

The MgZnO-based laser diode shown in FIG. 8 is formed of a laminated structure including a sapphire substrate 140, on which a ZnO buffer layer 141, a p-type MgZnO clad layer 142, an MgZnO luminescent layer 143 and an n-type MgZnO clad layer 144 are successively laminated. An n-side electrode 146 is attached, via an indium/tin oxide (ITO) electrode layer 145, to the n-type clad layer 144. A p-side electrode 148 is attached, an ITO electrode layer 147, to the p-type MgZno clad layer 142.

EXAMPLES

Next, one example for manufacturing the semiconductor light-emitting device shown in FIG. 1 will be explained as one embodiment of the present invention.

First of all, the light-emitting element 14 of the semiconductor light-emitting device shown in FIG. 1 was formed as follows. By making use of barium silicate which was precipitated from water glass by making use of a sedimentation method, the light scattering particles and the phosphor were fixed to the surface of the substrate 16, thereby forming the white particle layer 22, the phosphor layer 24 and the inorganic transparent layer 26.

As for the substrate 16, an aluminum substrate having silver vapor-deposited on the surface thereof for enhancing the reflectance thereof was employed. Further, barium sulfate ($BaSO_4$) was employed as the light scattering particles. With respect to the phosphor, a mixture consisting of a blue phosphor material represented by $(Sr, Ca, Ba)_{10}(PO_4)_6C_{12}$:Eu and a yellow phosphor material represented by $3(Sr, Ca, Ba)_2Si_2O_4$:Eu was employed.

A mounting board 10 made of AlN was manufactured by means of molding work. A Metallic film of Au etc., was formed on the surface of the mounting board 10. The metallic film thus formed is then subjected to a patterning process by making use of photolithography, etching, etc., to thereby form interconnection layers 16a and 16b on the surface of the mounting board 10.

Then, a semiconductor laser diode equipped with an AlGaInN luminescent layer for generating violet light was mounted, as a light-emitting element 12, on the surface of interconnection layer 16a of the mounting board 10. Further, the luminescent element 14 obtained as described above was disposed on the surface of the mounting board 10 in such a manner that the inorganic transparent layer 26 was disposed to face the light-emitting element 12. Subsequently, by making use of a bonding wire 18, the interconnection layer 16b was electrically connected with the electrode (not shown) of the light-emitting element 12.

In the operation of the light-emitting device manufactured as described above, an operating voltage was applied between the electrodes of the light-emitting element 12 to oscillate a laser beam. The excitation light that was output from the light-emitting element 12 and directed toward the luminescent element 14 was absorbed by the luminescent element 14 and then white light was emitted in a direction different from the direction of incidence of the excitation light.

Figure 9:
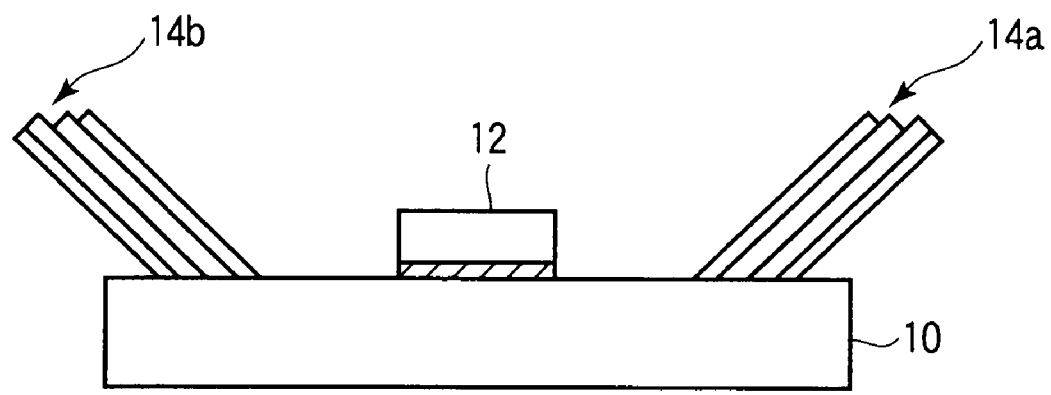
FIG. 9 is a cross-sectional view showing a semiconductor light-emitting element according to another embodiment of the present invention.

It should be noted that when an edge-face emitting type light-emitting element 12 is to be employed, it is possible for the excitation light to be emitted from both oppositely facing edge faces thereof. In this case, the light-emitting elements 14a and 14b may be disposed to respectively face these edge faces from which the excitation light can be emitted as shown in FIG. 9.

Although the present invention has been explained with reference to embodiments and example, these embodiments and example should not be construed as limiting the present invention. Namely, the present invention may be variously modified other than these embodiments and example.

For example, in the embodiments described above, there is employed a light-emitting device where a luminescent element capable of radiating white light is used. However, the present invention is not limited to the emission of white light but can be applied also to light-emitting devices wherein visible light of other colors can be emitted. For example, a luminescent element capable of radiating red, orange, yellow, yellowish green, green, bluish green, blue, violet or white visible light may be also utilized depending on the end use.

As for the end use of the light-emitting device according to the present invention, it includes ordinary lighting equipment, lighting equipment for business use, backlighting for the liquid crystal display of a television or personal computer, lighting systems of motor cars, motorbikes, and bicycles, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting device comprising:
   a semiconductor light-emitting element emitting light in a region ranging from ultraviolet to visible; and
   a visible-light luminescent element absorbing light emitted from the semiconductor light-emitting element and outputting visible light;
   wherein the visible-light luminescent element includes a substrate, a light scattering particle layer, including contacting light scattering particles, formed on the substrate, a phosphor particle layer, including contacting phosphor particles, formed on the light scattering particle layer, and an inorganic transparent layer formed on the phosphor particle layer,
   the phosphor particle layer absorbs light emitted from the semiconductor light-emitting element and output visible light, and
   the phosphor particle layer further absorbs light that is emitted from the semiconductor light-emitting element, arrives at and is reflected from the light scattering particles, and output the visible light.

2. The device according to claim 1, wherein the light scattering particle layer comprises an inorganic material containing silicon and fixing the light scattering particles, and the phosphor particle layer comprises an inorganic material containing silicon and fixing the phosphor particles.

3. The device according to claim 1, wherein the light scattering particles are formed of one kind of material selected from the group consisting of $BaSO_4$, $MgO$, $TiO_2$, $AlO_3$, $ZnO$ and $SiO_2$.

4. The device according to claim 3, wherein the light scattering particle layer comprises a layer of the light scattering particles having a thickness of not greater than 300 μm.

5. The device according to claim 1, wherein the phosphor particles are formed of at least one kind of material selected from the group consisting of silicate-based fluorescent material, an aluminate fluorescent-based material, a nitride-based fluorescent material, a sulfide-based fluorescent material, an oxysulfide-based fluorescent material, a YAG-based fluorescent material, a borate-based fluorescent material, a phosphate-based fluorescent material, a halo-phosphate-based fluorescent material.

6. The device according to claim 1, wherein the phosphor particles are formed of a combination of a red color-emitting phosphor, a green color-emitting phosphor and a blue color-emitting phosphor, thereby creating a white color-emitting phosphor.

7. The device according to claim 1, wherein the phosphor particles are formed of a combination of different kinds of phosphors each emitting a complementary color, thereby creating a white color-emitting phosphor.

8. The device according to claim 1, wherein the phosphor particle layer comprises a layer of the phosphor particles, having a thickness one to three times greater than the particle diameter of the phosphor particles.

9. The device according to claim 8, wherein the layer of the phosphor particles has a thickness of 20-100 μm.

10. The device according to claim 2, wherein the inorganic material containing silicon is alkali metal silicate.

11. The device according to claim 1, wherein the substrate is designed to reflect the visible light at 75% or more.

12. The device according to claim 11, wherein the substrate is formed of at least one kind of material selected from the group consisting of aluminum, copper, stainless steel and ceramic.

13. The device according to claim 1, wherein the semiconductor light-emitting element has an emission peak whose wavelength is 430 nm or less.

14. The device according to claim 1, wherein the semiconductor light-emitting element is an edge-face emitting type or a surface emitting type semiconductor laser diode.

15. The device according to claim 1, wherein the semiconductor light-emitting element includes a light emitting layer formed of a nitride semiconductor containing at least one kind of material selected from the group consisting of aluminum, gallium and indium.

16. The device according to claim 1, wherein the semiconductor light-emitting element includes a light emitting layer formed of an oxide semiconductor containing at least one kind of material selected from the group consisting of magnesium and zinc.

17. The device according to claim 1, wherein the visible-light luminescent element is inclined with respect to the optical axis of the light to be emitted from the semiconductor light-emitting element.

18. The device according to claim 17, wherein the visible-light luminescent element is inclined at an angle of 30° to less than 90° with respect to an optical axis of light emitted from the semiconductor light-emitting element.

19. The device according to claim 1, wherein the light scattering particle layer, the phosphor particle layer, and the inorganic transparent layer are formed by a sedimentation method in which light scattering particles and phosphor particles are fixed to the surface of the substrate.

* * * * *